(12) United States Patent
Huang et al.

(10) Patent No.: US 6,171,128 B1
(45) Date of Patent: Jan. 9, 2001

(54) ELECTRICAL CONNECTOR

(75) Inventors: Yao-Chi Huang, Yung-Ho; Nick Lin, Hsin-Chuang, both of (TW)

(73) Assignee: Hon Hai Precision Ind. Co., Ltd., Taipei (TW)

( * ) Notice: Under 35 U.S.C. 154(b), the term of this patent shall be extended for 0 days.

(21) Appl. No.: 09/387,933

(22) Filed: Sep. 1, 1999

(30) Foreign Application Priority Data

Apr. 6, 1999 (TW) .................................................. 88205239

(51) Int. Cl.⁷ ................................................... H01R 13/62
(52) U.S. Cl. ............................................................ 439/342
(58) Field of Search .......................... 439/342, 259–270, 439/876, 83, 70

(56) References Cited

U.S. PATENT DOCUMENTS 5,658,160 * 8/1997 Lai ........................................ 439/342
5,730,615 * 3/1998 Lai et al. .............................. 439/342

* cited by examiner

Primary Examiner—Gary F. Paumen
(74) Attorney, Agent, or Firm—Wei Te Chung (57) ABSTRACT

An electrical connector comprises a base having a number of contacts received therein, a cover movably mounted on the base, a pair of first plates and a pair of second plates. The first and second plates are respectively positioned at opposite diagonal corners of the cover and the base. Each first plate faces an associated second plate. In operation, a tool positioned between the faced first and second plates is used to push the second plate from the first plate thereby driving the cover along the base in the diagonal direction.

2 Claims, 8 Drawing Sheets

ELECTRICAL CONNECTOR

BACKGROUND OF THE INVENTION

The present invention relates to a connector, and particularly to a zero insertion force connector.

Description of the Prior Art

U.S. Pat. No. 5,730,615 and Taiwan Patent Application Nos. 80211197, 82213952 and 82214483 disclose zero insertion force connectors. The connector disclosed in the U.S. Pat. No. 5,730,615 comprises a base, a cover movably mounted on the base, a plurality of contacts received in the base and a driving mechanism. The cover defines a plurality of cavities in compliance with the contacts received in the base. The cover and the base each include an expansion section proximate a rear portion of the connector with tool receiving slots defined therein. A chip is mounted on the cover with pins thereof extending through the cavities of the cover and openings of the contacts when the cover is positioned at an open state. A tool such as a lever is inserted in the tool receiving slots of the base and the cover to drive the cover along the base in a predetermined direction thereby causing the pins of the chip to electrically engage with the corresponding contacts of the connector.

However, the cover and the base are not durable because they are usually made from plastic material. Thus, after the cover is driven along the base by the lever a few times, the expansion sections might wear away thereby hindering operation and resulting in an unreliable engagement between the pins of the chip and the contacts of the connector. Furthermore, the connector does not have elevating mechanisms for elevating a mounting face thereof from a printed circuit board. Thus, during a soldering procedure, molten solder balls are possibly crushed by the weight of the connector and a short circuit may result. Hence, an improved electrical connector is required to overcome the disadvantages of the prior art.

BRIEF SUMMARY OF THE INVENTION

An object of the present invention is to provide an electrical connector having durable members for enduring an external force exerted on the connector when driving a cover along a base of the connector.

Accordingly, an electrical connector comprises a base having a plurality of contacts received therein, a cover movably mounted on the base, and a pair of first plates and a pair of second plates respectively secured in the base and the cover. The base defines two pairs of slots therethrough at opposite diagonal corners thereof and provides a station proximate each pair of slots. Each first plate comprises a main portion, a first wing and a second wing perpendicularly extending from opposite edges of the main portion. The first plates are upwardly assembled to the base with the first and second wings respectively received in the slots of the base and the main portion abutting against a bottom face of the base. A part of the first wing extends beyond a top face of the base and abuts the station for preventing an outward movement thereof.

According to one aspect of the present invention, the cover defines a pair of recessed surfaces in opposite faces of each opposite diagonal corner thereof and provides a pair of projections on each recessed surface. Each second plate comprises a connecting portion, a pair of tabs perpendicularly extending from one edge of the connecting portions, and a slab perpendicularly extending from an opposite edge of the connecting portion. Each tab defines a hole and the slab defines a pair of holes. The projections on the recessed surfaces are secured in the holes of tabs and the slab thereby securing the second plates to the cover.

According to another aspect of the present invention, the first and second plates are such arranged that each first plate facing an associated second plate. Therefor, the first and second plates are pushed against each other by a tool position therebetween to drive the cover along the base thereby electrically engaging the contacts with corresponding pins of a chip.

Other objects, advantages and novel features of the invention will become more apparent from the following detailed description of the present embodiment when taken in conjunction with the accompanying drawings.

DETAILED DESCRIPTION OF THE INVENTION

It is noted here that for facilitating understanding like components are designated by like reference numerals throughout the various embodiments as shown in the attached drawing fingers.

Figure 1:
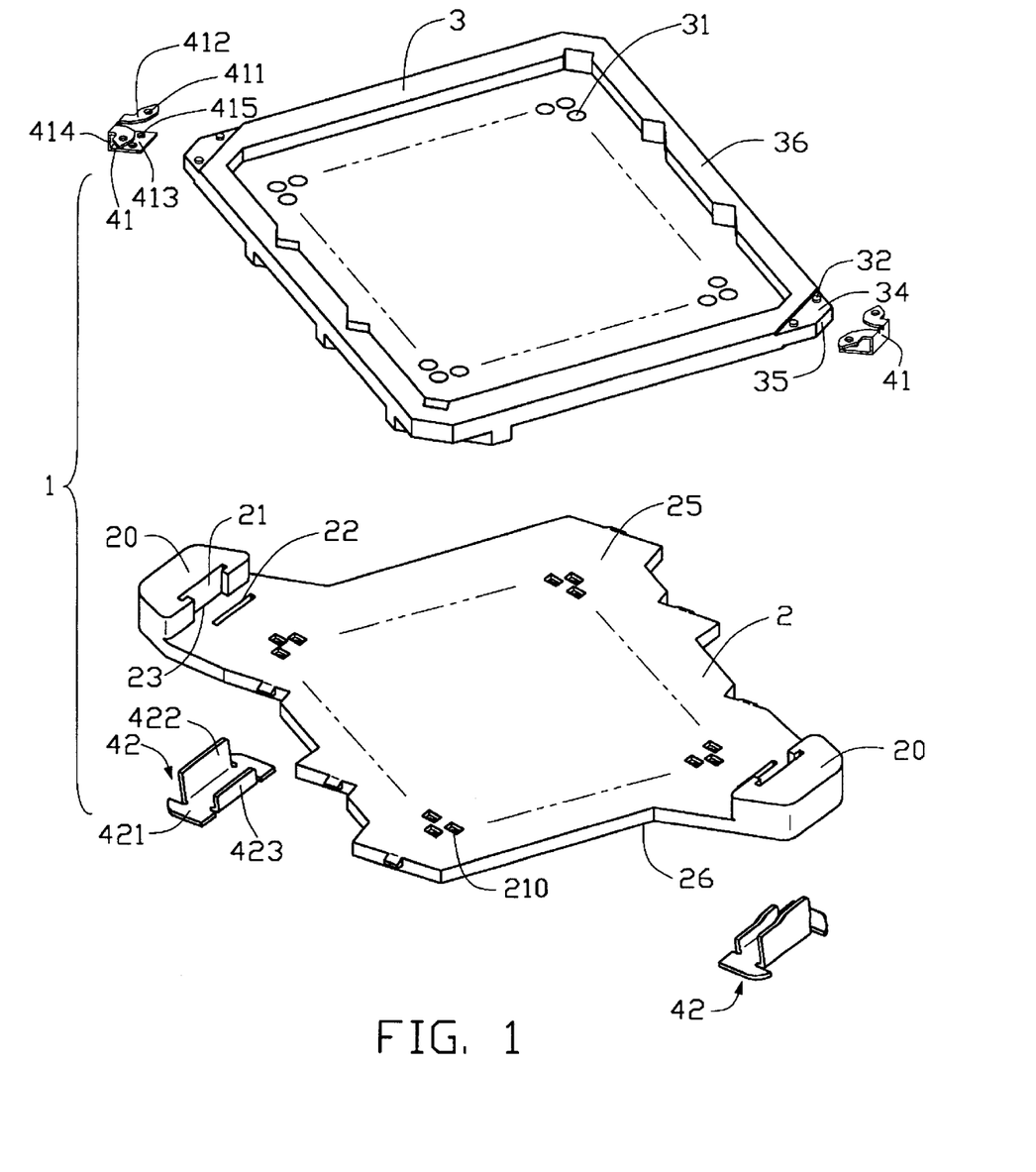
FIG. 1 is an exploded view of an electrical connector in accordance with a first embodiment of the present invention.
Figure 2:
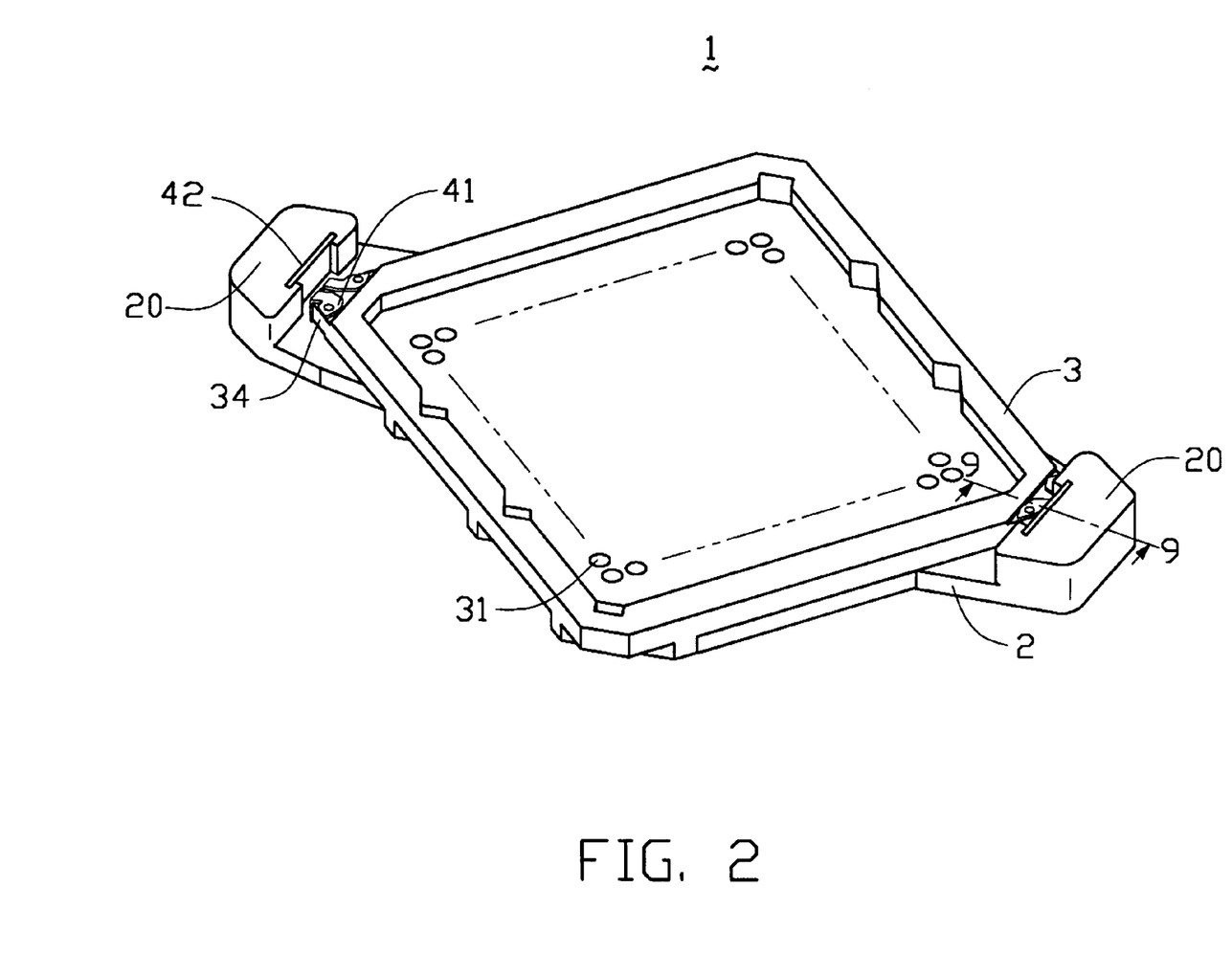
FIG. 2 is an assembled view of FIG. 1.

Referring to FIGS. 1 and 2, an electrical connector assembly 1 in accordance with a first embodiment of the present invention comprises a base 2 having a plurality of conductive contacts 210 received therein, a cover 3 defining a plurality of apertures 31, and a pair of second plates 41 and a pair of first plates 42 made from durable material such as metal. The base 2 defines two pairs of slots 23 therethrough at opposite diagonal corners thereof and provides a station 20 proximate each pair of slots 23. A flange 36 is formed around a periphery of the cover 3. The cover 3 defines a pair of recessed surfaces 34 in opposite faces of each opposite diagonal comer thereof and provides a pair of projections 32 on each recessed surface 34 for securing the second plates 41 to the cover 3.

Figure 3:
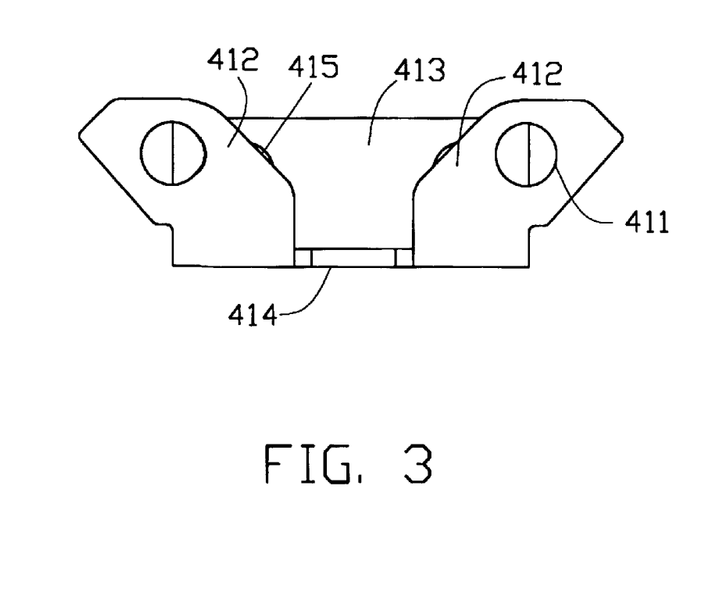
FIG. 3 is a top view of a first plate of the electrical connector of the present invention.
Figure 4:
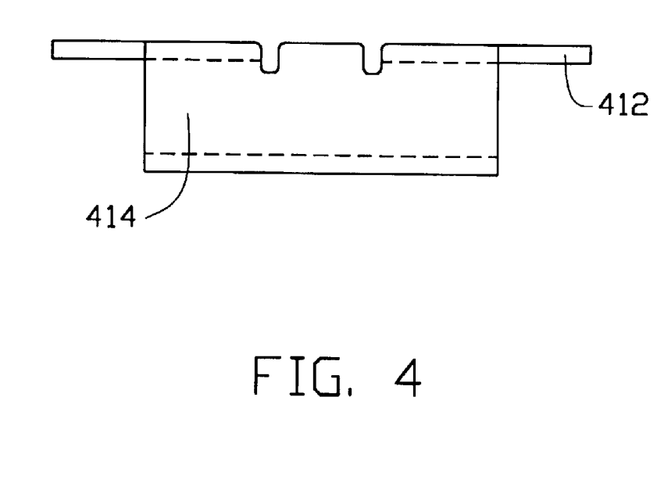
FIG. 4 is a front view of FIG. 3.
Figure 5:
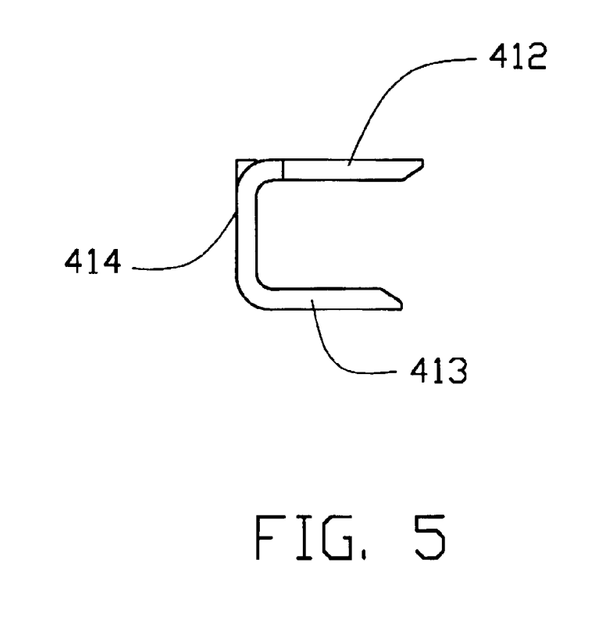
FIG. 5 is a right side view of FIG. 3.

Also referring to FIGS. 3–5, the second plate 41 comprises a connecting portion 414, a slab 413 perpendicularly extending from one edge of the connecting portion 414 and a pair of tabs 412 perpendicularly extending from an opposite edge of the connecting portion 414 in the same direction as the slab 413. The slab 413 defines a pair of holes 415 and each tab 412 defines a hole 411 to accommodate the corresponding projections 32 of the cover 3.

Figure 6:
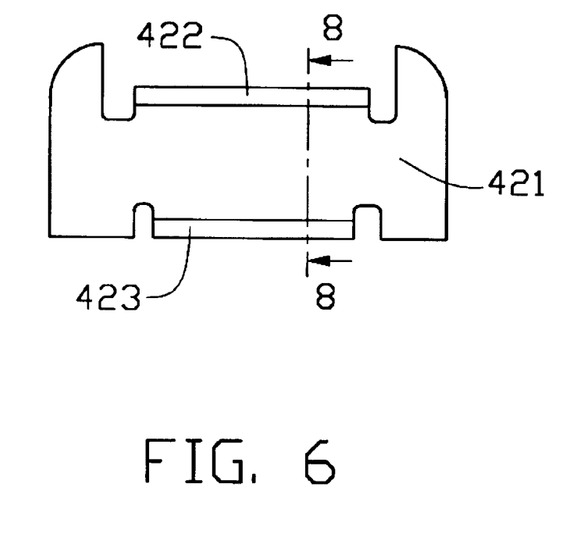
FIG. 6 is a top view of a second plate of the electrical connector of the present invention.
Figure 7:
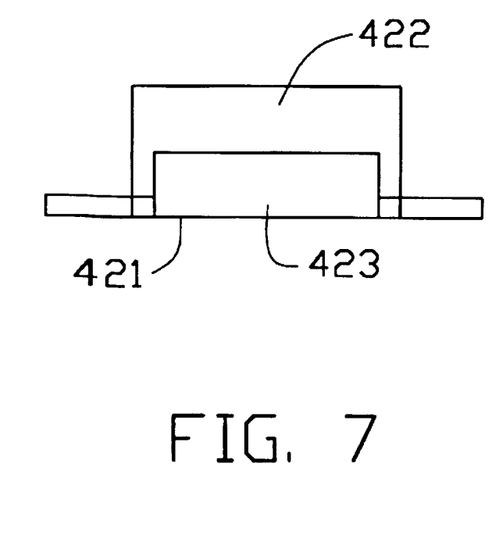
FIG. 7 is a front view of FIG. 6.
Figure 8:
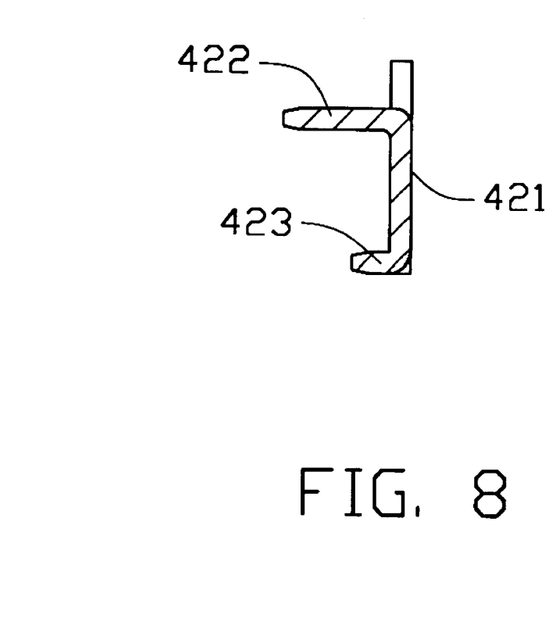
FIG. 8 is a cross-sectional view taken along line 8—8 of FIG. 6.

Referring to FIGS. 1, 6, and 8, the first plate 42 comprises a main portion 421, and first and second wings 422, 423 perpendicularly extending from opposite edges of the main portion 421. The first wing 422 has a larger height than the second wing 423.

Figure 9:
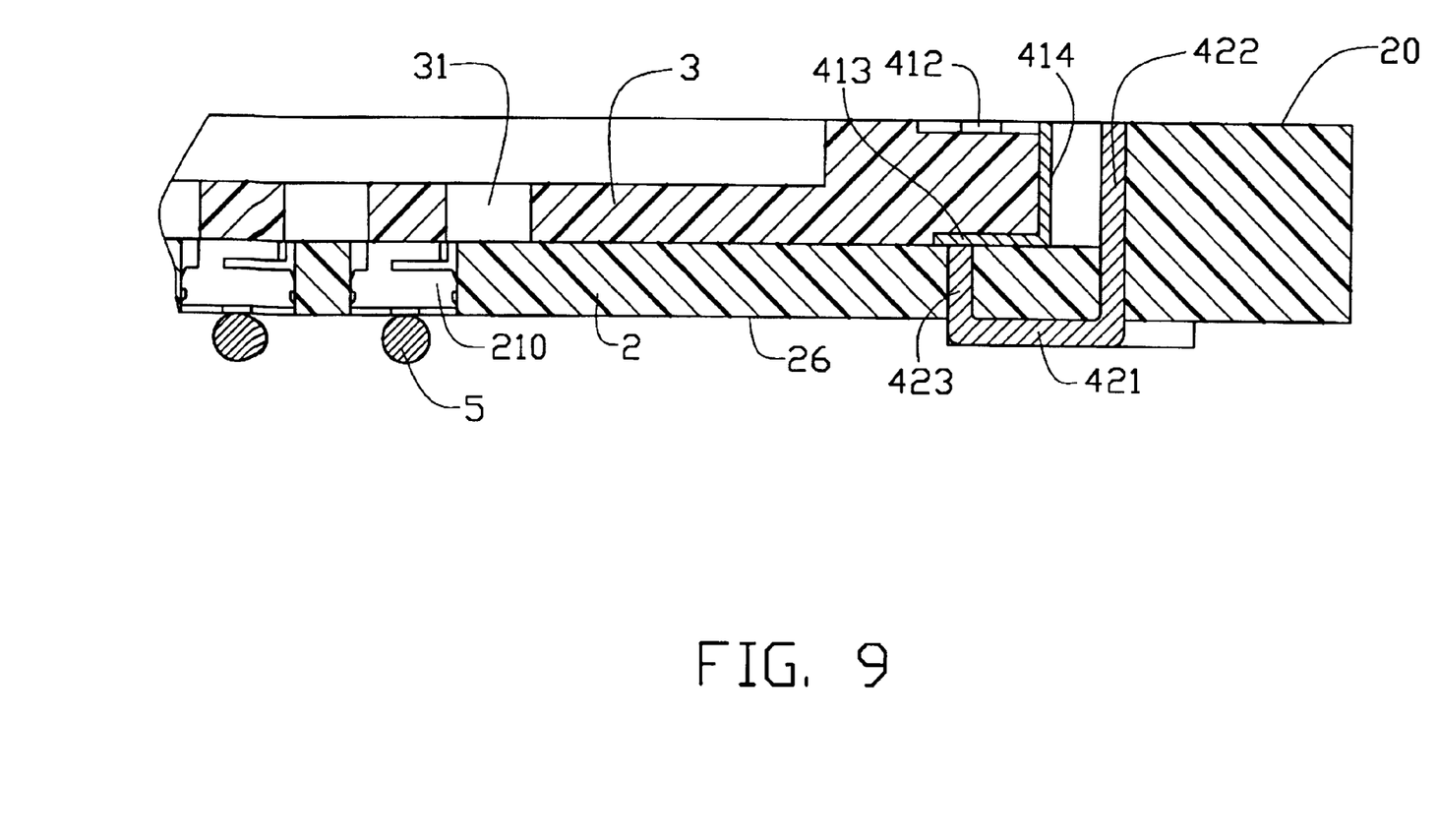
FIG. 9 is a cross-sectional view of the assembled connector taken along line 9—9 of FIG. 2.

Referring to FIGS. 1, 2 and 9, in assembly, the tabs 412 and the slab 413 of each second plate 41 are outwardly expanded by an external force to accommodate the corresponding corners of the cover 3 and then retract to their original shapes. The projections 32 on the recessed surfaces 34 of the corresponding corners are secured in the corresponding holes 411, 415 of the second plate 41. The connecting portion 414 abuts against a periphery 35 of the corresponding corner thereby securely retaining the second plate 41 to the cover 3. Each first plate 42 is upwardly assembled to the base 2 with the first and second wings 422, 423 respectively received in the slots 23 and the main portion 421 abutting against a bottom face 26 of the base thereby securing the first plate 42 to the base 2. The first wing 422 partially extends beyond a top face 25 of the base 2 and abuts against a wall 21 of the station 20. Therefor, each first plate 42 faces an associated second plate 41 and a gap is defined therebetween. The main portions 421 space the base 2 a distance smaller than a dimension of a solder ball 5 from a printed circuit board (not shown) to prevent the solder ball 5 from being crushed by the weight of the connector 1 when the connector 1 is mounted onto the printed circuit board by a soldering procedure.

In operation, a tool (not shown), such as a lever, is positioned between the faced first and second plates 41, 42 and pushes the faced first and second plates 41, 42 against each other thereby driving the cover 3 along the base 2 in a diagonal direction. During the operation, the tool abuts against the connecting portion 414 of the second plate 41 and the part of the first wing 422 extending beyond the top face 25 of the base 2 and are distanced from the base 2 and the cover 3. Thereby, the base 2 and the cover 3 are protected from damage which makes the connector 1 durable. Furthermore, when one of the first or second plates 41, 42 is worn out, the connector 1 is still usable by replacing the plate with a new one, which saves consumer's cost.

Figure 10:
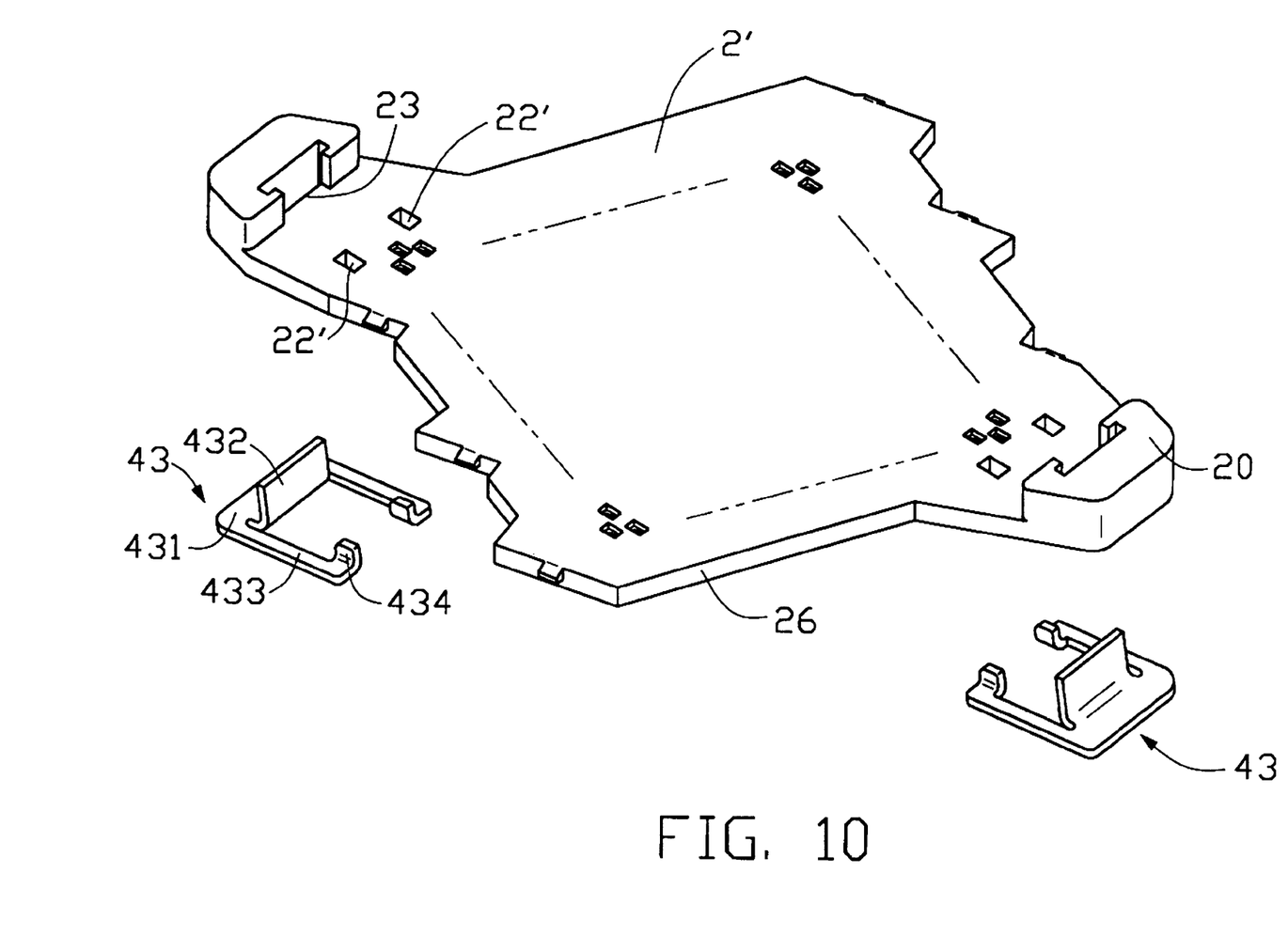
FIG. 10 is an exploded view of a base and a third plate in accordance with a second embodiment of the electrical connector of the present invention.
Figure 11:
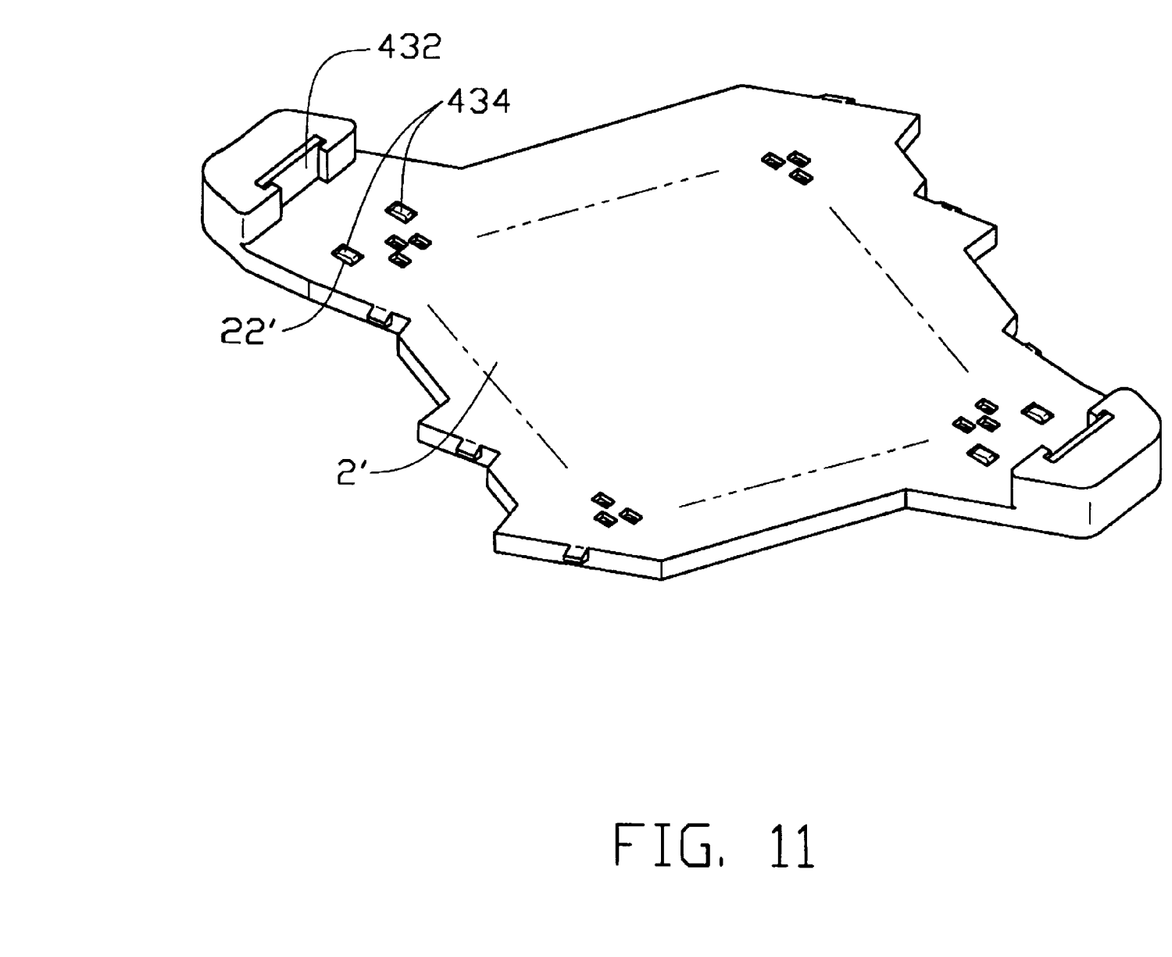
FIG. 11 is an assembled view of FIG. 10.

Referring to FIGS. 10 and 11, a third plate 43 and a base 2' partially constitute a second embodiment of the connector 1 for cooperation with the cover 3 and the second plate 41 of the first embodiment. The base 2' is similar to the base 2 of the first embodiment except that one of the slots 23 is replaced by a pair through holes 22'. The third plate 43 comprises a main portion 431, a tongue 432 upwardly extending from opposite ends of the main portion 431 and a pair of arms 433 laterally extending from the main portion 431. Each arm 433 further forms a lip 434 upwardly extending from a free end thereof. The third plate 43 is upwardly assembled to the base 2' with the tongue 432 and the lips 434 respectively received in the slot 23 and the through holes 22', and the main portion 431 and the arms 432 abutting against the bottom face 26 of the base 2'.

It must be known that it is a preferred embodiment that the first and second plates 42, 41 are positioned at the opposite corners of the base 2 and the cover 3. The present invention also includes such similar embodiment as the first and second plates 42, 41 being positioned in opposite edges of the base 2 and the cover 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of recessed plates within the principles of the invention to the full extent indicated by the broad general meaning of the terms in which the appended claims are expressed.

What is claimed is:

1. An electrical connector comprising:

a base defining a plurality of cavities;

a plurality of contacts received in corresponding cavities of the base;

a cover movably assembled to the base and having a plurality of apertures corresponding to said cavities; and guiding means arranged between the base and the cover for insertion of a tool therebetween to drive the cover with respect to the base the tool engaging the guiding means and being made of material more durable than that of the base and cover;

wherein the guiding means comprises: a pair of first plates disposed in the base, the first plates being spaced from each other in the predetermined direction; and a pair of second plates disposed in the cover, each second plate facing an associated first plate and being spaced a predetermined distance from the associated second plate;

wherein the first plates are secured to opposite diagonal corners of the base and the second plates are secured to corresponding opposite diagonal corners of the cover;

wherein the base defines a pair of slots at each opposite diagonal corner thereof, and wherein the first plate comprises a main portion and first and second wings upwardly extending from opposite edges of the main portion, respectively, the first and second wings being respectively received in the slots, a part of the first wing extending beyond a top face of the base;

wherein the base provides a station at each opposite diagonal corner thereof, the station having a wall, the part of the first wing bearing against the wall to prevent an outward movement thereof.

2. An electrical connector comprising:

a base defining a plurality of cavities;

a plurality of contacts received within the corresponding cavities, respectively;

a cover movably assembled atop the base and defining a plurality of apertures in vertical alignment with the corresponding cavities, respectively;

two guiding means respectively disposed at two outermost positions along a movement direction of the cover with regard to the base; wherein each of said guiding means being made from material more durable than that of the base and cover, includes a first plate attached to the base, and a second plate attached to the cover opposite to said first plate, and a minimum space remains between said first plate and said second plate for allowing an external tool to be inserted thereto and actuate the cover to move the tool engaging the first and second plates.

* * * * *